US007608869B2

(12) United States Patent
Yang et al.

(10) Patent No.: US 7,608,869 B2
(45) Date of Patent: Oct. 27, 2009

(54) THIN FILM TRANSISTOR AND METHOD OF FABRICATING THE SAME

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR)

(73) Assignee: Samsung Mobile Display Co., Ltd., Gyeonggi-do (KR)

( * ) Notice: Subject to any disclaimer, the term of this patent is extended or adjusted under 35 U.S.C. 154(b) by 64 days.

(21) Appl. No.: 11/509,863

(22) Filed: Aug. 24, 2006

(65) Prior Publication Data

US 2007/0052023 A1 Mar. 8, 2007

(30) Foreign Application Priority Data

Aug. 25, 2005 (KR) ..................... 10-2005-0078469

(51) Int. Cl.
*H01L 29/76* (2006.01)

(52) U.S. Cl. ....................... 257/288; 438/166; 438/486; 257/290; 257/368; 257/E21.37; 257/E21.535

(58) Field of Classification Search ................. 438/166, 438/486; 257/213, 288, 290, 368, E21.37, 257/E21.535

See application file for complete search history.

(56) References Cited

U.S. PATENT DOCUMENTS 7,250,312 B2 * 7/2007 Koezuka et al. ............... 438/14
2004/0241395 A1 * 12/2004 Jing et al. ................ 428/195.1
2005/0074963 A1 * 4/2005 Fujii et al. .................. 438/623
2005/0158928 A1 * 7/2005 So ............................ 438/166
2006/0030085 A1 * 2/2006 Park et al. ................... 438/149

FOREIGN PATENT DOCUMENTS

KR 10-2003-0060403 A 7/2003

* cited by examiner

*Primary Examiner*—Hsien-ming Lee
(74) *Attorney, Agent, or Firm*—Knobbe Martens Olson & Bear LLP

(57) ABSTRACT

A thin film transistor and a method of fabricating the same are disclosed. The method includes: sequentially depositing an amorphous silicon layer, a capping layer, and a metal catalyst layer; annealing the entire layer to crystallize the amorphous silicon layer into a polysilicon layer; removing the capping layer; and, when the capping layer is perfectly removed to make a contact angle of the polysilicon layer within a range of about 40 to about 80°, forming a semiconductor layer using the polysilicon layer.

17 Claims, 6 Drawing Sheets

150
145
140
130
160
110
100

$\theta_1$
200
160
110
100

THIN FILM TRANSISTOR AND METHOD OF FABRICATING THE SAME

CROSS-REFERENCE TO RELATED APPLICATIONS

This application claims priority to and the benefit of Korean Patent Application No. 10-2005-0078469, filed on Aug. 25, 2005, the disclosure of which is incorporated herein by reference in its entirety.

BACKGROUND OF THE INVENTION

1. Field of the Invention

The present invention relates to a thin film transistor and a method of fabricating the same, and more particularly, to a thin film transistor having a polysilicon semiconductor layer, and a method of fabricating the same.

2. Description of the Related Technology

Conventionally, a polysilicon layer has been widely used as a semiconductor layer for a thin film transistor, since it has high electric field effect mobility to be adapted to a high-speed circuit and a complementary metal oxide semiconductor (CMOS) circuit. A thin film transistor having such a polysilicon layer is used in an active device of an active matrix liquid crystal display (AMLCD), and a switching device and a driving device of an organic light emitting display (OLED).

The polysilicon layer used in the thin film transistor may be manufactured by a direct deposition method, a high temperature annealing method, or a laser annealing method. The laser annealing method can be performed at a low temperature and may implement high electric field effect mobility. However, since the laser annealing method requires a very expensive laser equipment, alternatives have been actively sought.

Currently, a method of crystallizing amorphous silicon using a metal is being widely researched since it can crystallize amorphous silicon at a lower temperature, compared to solid phase crystallization. The crystallization method using a metal may includes a metal induced crystallization (MIC) method and a metal induced lateral crystallization (MILC) method. However, in the case of the method of using a metal catalyst, characteristics of the thin film transistor may be degraded due to contamination caused by the metal catalyst.

In order to prevent the contamination caused by the metal catalyst, a crystallization method of fabricating a polysilicon layer using a capping layer is disclosed in Korean Patent Application Publication No. 2003-60403. The method includes depositing an amorphous silicon layer and a capping layer on a substrate, forming a metal catalyst layer on the substrate, diffusing the metal catalyst into the amorphous silicon layer through the capping layer using an annealing method or a laser annealing method to form a seed, and forming a polysilicon layer using the seed.

SUMMARY OF CERTAIN INVENTIVE ASPECTS

One aspect of the invention provides a thin film transistor comprising: a substrate; a semiconductor disposed on the substrate, and having a contact angle of the liquid droplet of about 40 to about 80 degrees; and a gate insulating layer, a gate electrode, an interlayer insulating layer, and source and drain electrode, which are disposed on the semiconductor layer.

The semiconductor layer may be a polysilicon layer crystallized by an SGS crystallization method. The liquid droplet has a diameter between about 2 mm and about 5 mm. The liquid droplet may comprise a water droplet. A metal catalyst remaining in the polysilicon layer has a concentration of about $10^{13}$ atoms/cm$^2$ or less.

Another aspect of the invention provides a method of making a thin film transistor. The method comprises: forming a semiconductor layer over a substrate, the semiconductor layer comprising amorphous silicon; forming a capping layer over the semiconductor layer; forming a metal catalyst layer over the capping layer, the metal catalyst layer comprising a metal catalyst; annealing the substrate, the semiconductor layer, the capping layer, and the metal catalyst layer, such that at least a portion of the metal catalyst diffuses into the semiconductor layer, and such that the amorphous silicon is crystallized into polysilicon; removing the metal catalyst layer; and removing the capping layer from over the semiconductor layer, to an extent that, when a liquid droplet is placed over the semiconductor layer, a contact angle of the liquid droplet is from about 40 degrees to about 80 degrees.

The method may further comprise measuring the contact angle after removing the capping layer. The capping layer may be single-layered. The capping layer may comprise multiple layers. The capping layer may comprise one or more materials selected from the group consisting of silicon oxide and silicon nitride. The polysilicon may be more hydrophobic than the capping layer. After removing the catalyst layer and before removing the capping layer, the capping layer may have a contact angle of about 40 degrees or less when a water droplet is placed on the capping layer. The method may further comprise patterning the semiconductor layer after removing the capping layer. The liquid droplet has a diameter between about 2 mm and about 5 mm. The liquid droplet may comprise a water droplet. The contact angle is an acute angle formed between the baseline of the liquid droplet and the tangential line at the droplet boundary.

Another aspect of the invention provides a method of making a display device comprising a thin film transistor (TFT). The method comprises: providing an intermediate device comprising a substrate, a polysilicon layer over the substrate, a capping layer over the polysilicon layer; removing the capping layer from over the polysilicon layer; and determining whether the capping layer has been substantially completely removed from over the polysilicon layer.

The determining may comprise: placing a liquid droplet over the polysilicon layer; and measuring a contact angle of the liquid droplet. The method may further comprise, after measuring the contact angle, patterning the semiconductor layer if the measured contact angle is from about 40 degrees to about 80 degrees.

BRIEF DESCRIPTION OF THE DRAWINGS

The above and other features of the invention will be described in reference to certain exemplary embodiments thereof with reference to the attached drawings in which.

DETAILED DESCRIPTION OF CERTAIN INVENTIVE EMBODIMENTS

Figure 1:
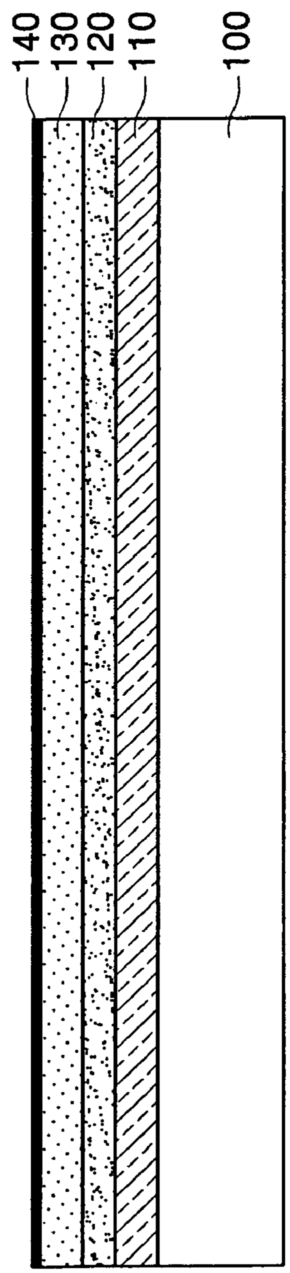
FIGS. 1 to 3 are cross-sectional views showing a process of crystallizing an amorphous silicon layer into a polysilicon layer using an SGS crystallization method in accordance with an embodiment.

Embodiments of the invention will now be described more fully hereinafter with reference to the accompanying drawings. The invention may, however, be embodied in different forms and should not be construed as limited to the embodiments set forth herein. In the drawings, the thickness of layers and regions may be exaggerated for clarity. Like reference numerals indicate identical or functionally similar elements throughout the specification.

Figure 2:
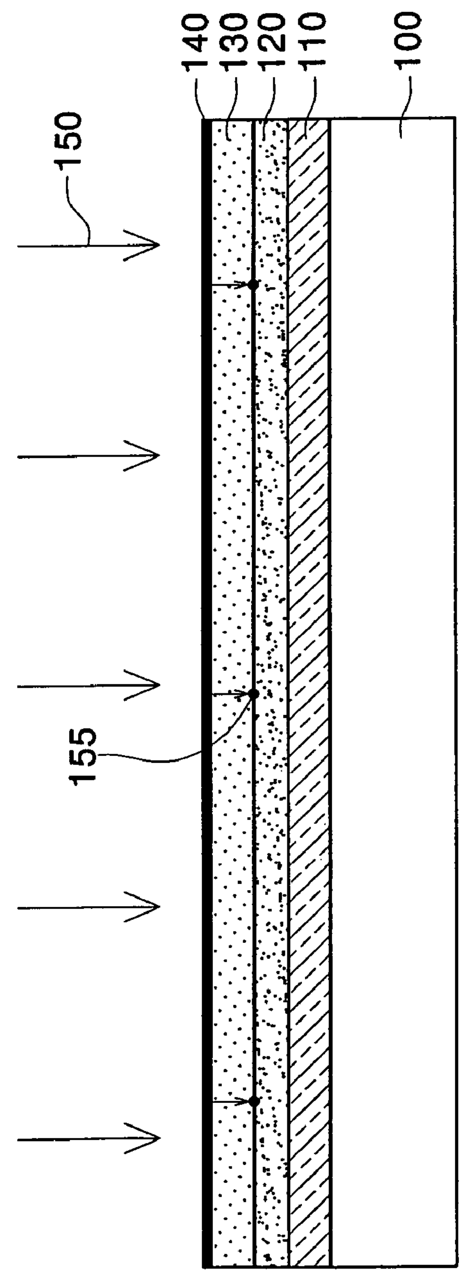
Figure 3:
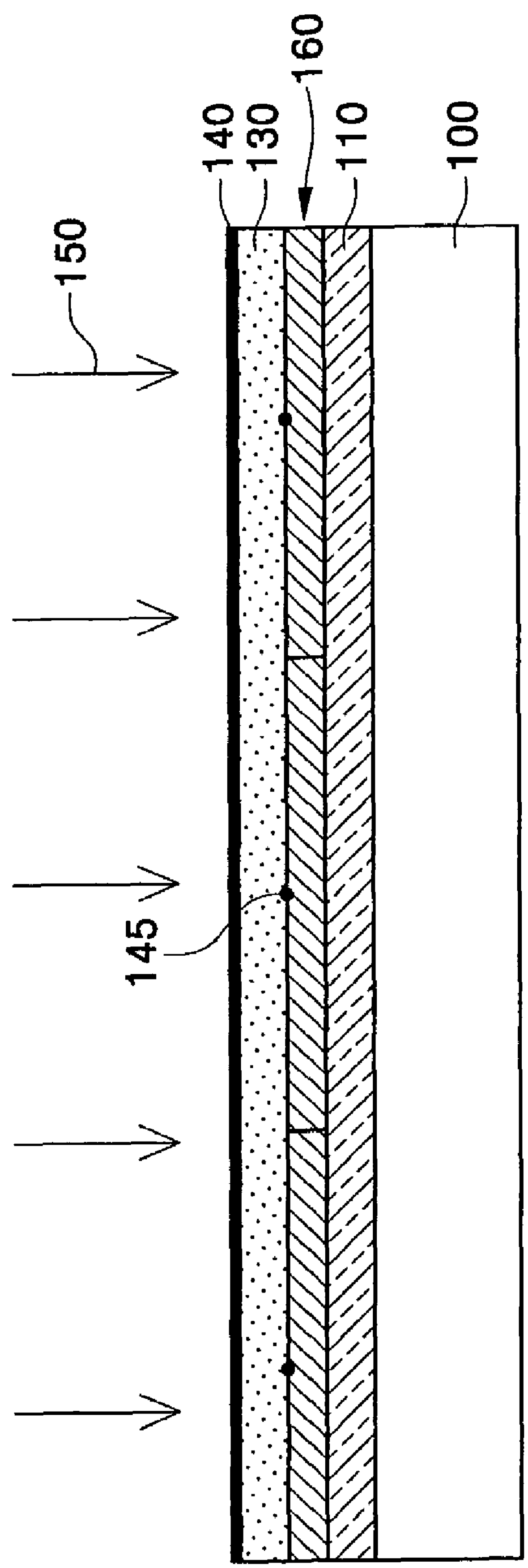

FIGS. 1 to 3 are cross-sectional views showing a process of crystallizing an amorphous silicon layer into a polysilicon layer using an SGS crystallization method in accordance with an embodiment.

Referring to FIG. 1, a buffer layer 110 formed of a silicon oxide layer, a silicon nitride layer, or a multi-layer thereof is deposited on a transparent insulating substrate 100 such as a glass or plastic substrate, using a physical vapor deposition method or a chemical vapor deposition method. The buffer layer 110 prevents diffusion of moisture and impurities generated from the lower substrate, or adjusts the heat transfer rate during crystallization, thereby facilitating crystallization of an amorphous silicon layer.

Then, an amorphous silicon layer 120 is formed on the buffer layer 110 using a physical vapor deposition method or a chemical vapor deposition method. Next, a capping layer 130 formed of a silicon oxide layer, a silicon nitride layer, or a multi-layer thereof is deposited on the amorphous silicon layer 120. In certain embodiments, the capping layer may be formed of an organic material.

Then, a metal catalyst layer 140 is formed on the capping layer 130. In one embodiment, the metal catalyst layer 140 may be formed of at least one selected from the group consisting of Ni, Pd, Ti, Ag, Au, Al, Sn, Sb, Cu, Co, Mo, Cr, Ru, Rh, Cd, and Pt. In one embodiment, the metal catalyst layer 140 contains a metal catalyst in a surface concentration of about $10^{11}$ to about $10^{15}$ atoms/$cm^2$.

Referring to FIG. 2, the substrate 100 including the amorphous silicon layer 120, the capping layer 130, and the metal catalyst layer 140 is annealed as shown in arrows 150 to diffuse the metal catalyst of the metal catalyst layer 140 into the amorphous silicon layer 120 through the capping layer 130, as shown in arrows 155. The metal catalyst particles diffused to the amorphous silicon layer 120 may form seeds 145 (FIG. 3) which serve as nuclei of crystallization.

Referring FIG. 3, when the substrate 100 having the amorphous silicon layer 120, on which the seeds 145 are formed, is continuously annealed, crystallinity of the seeds 145 is propagated to the amorphous silicon layer 120 to be crystallized into a polysilicon layer 160.

In one embodiment, the size and properties of the polysilicon layer 160 are determined by characteristics or interval of the seeds 145. For example, the greater the interval between the seeds 145 becomes, the bigger the sizes of grains of the polysilicon layer 160 are.

The method, which may be referred to as a super grain silicon (SGS) crystallization method, includes forming an amorphous silicon layer, a capping layer, and a metal catalyst layer on a substrate, annealing the substrate, diffusing a metal catalyst of the metal catalyst layer into the amorphous silicon layer through the capping layer, forming seeds as nuclei of crystallization using the diffused metal catalyst, and growing crystals from the seeds formed on the amorphous silicon layer to crystallize the amorphous silicon into polysilicon. Then, the metal catalyst layer and the capping layers are removed from over the polysilicon.

In the above described SGS crystallization method, amorphous silicon is crystallized into polysilicon using the metal catalyst diffused therein. Because the capping layer is later removed together with a remaining metal catalyst therein, no further metal catalyst diffuses into and contaminates the polysilicon. In one embodiment, the metal catalyst remaining in the polysilicon layer has a concentration of about $10^{13}$ atoms/$cm^2$ or less. This concentration is lower than that of a metal catalyst in polysilicon layers formed by other crystallization methods. Thus, it is possible to fabricate a thin film transistor having excellent characteristics.

Figure 4A:
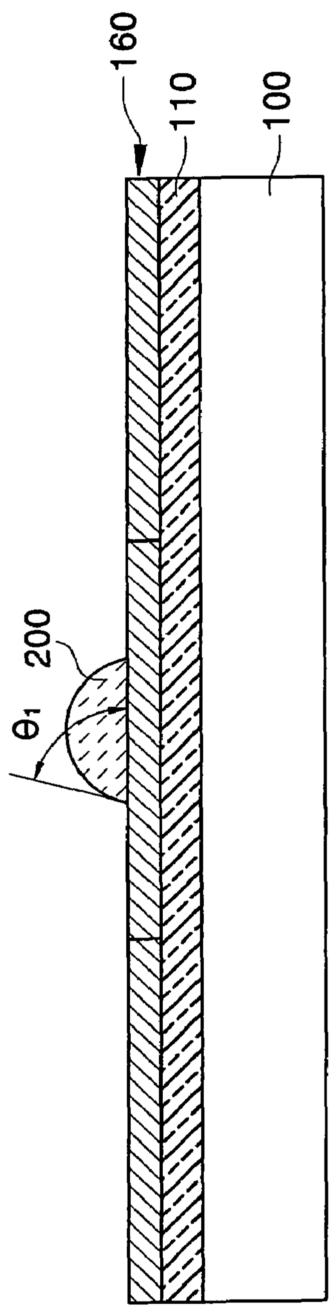
FIG. 4A is a cross-sectional view showing a contact angle of a water droplet over a polysilicon layer, when substantially no residual layer exists on the polysilicon layer.
Figure 4B:
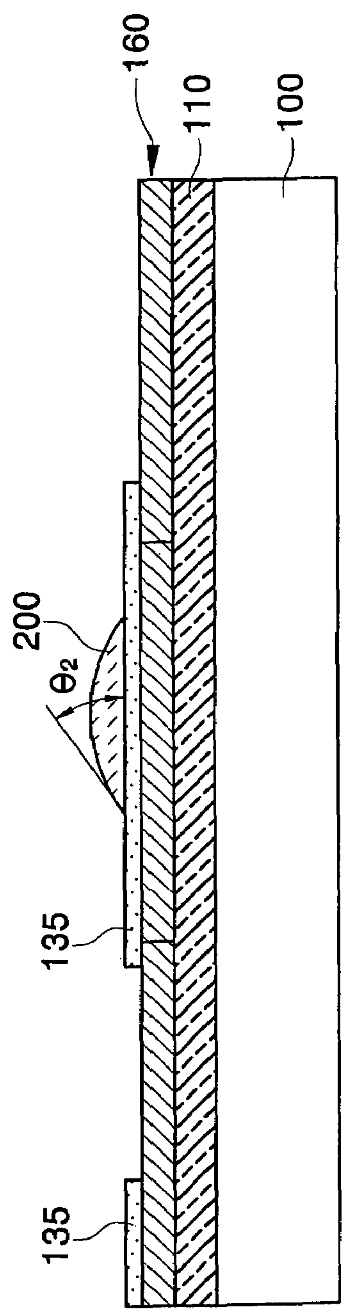
FIG. 4B is a cross-sectional view showing a contact angle of a water droplet over a polysilicon layer, when a residual capping layer exists on the polysilicon layer.

FIGS. 4A and 4B are cross-sectional views showing a contact angle of a polysilicon layer. The term “contact angle,” as used herein, refers to an angle at which a liquid/vapor interface meets a solid surface. A contact angle is an acute angle formed between the baseline of a liquid droplet and the tangential line at the droplet boundary. In one embodiment, the liquid is water. In other embodiments, various other liquid may be used in place of water. In FIGS. 4A and 4B, contact angles are denoted as “θ1” and “θ2,” respectively.

Referring to FIG. 4A, a contact angle Θ1 between the polysilicon layer 160 and a water droplet 200 is measured after removing the metal catalyst layer 140 and the capping layer 130. In the illustrated embodiment, there is substantially no capping layer remaining on the polysilicon layer 160. In one embodiment, the contact angle Θ1 is in a range of about 40° to about 80°.

At this time, since the polysilicon layer 160 has hydrophobicity, when there is no residual layer of the capping layer 130 on the polysilicon layer 160 as shown in FIG. 4A, the contact angle Θ1 of the polysilicon layer 160 becomes a high angle.

Referring to FIG. 4B, a residual capping layer 135 still remains on the polysilicon layer 160 after removing the capping layer. A water droplet 200 is placed over the residual capping layer 135 to measure a contact angle thereof. In this case, a contact angle θ2 is not more than about 40°.

The contact angle Θ2 of not more than about 40° indicates that the capping layer 140 has not been completely removed, and thus a residual layer 135 of the capping layer 140 remains as shown in FIG. 4B. Since the residual layer 135 of the capping layer 140 is formed of a silicon oxide layer, a silicon nitride layer, or a multi-layer thereof having a high hydrophilicity, the contact angle of the water droplet 200 is within a low range.

While not shown in FIGS. 4A and 4B, when a contact angle between the polysilicon layer 160 and the water droplet 200 is measured, the water droplet 200 may be formed across a boundary between the polysilicon layer 160 and the residual layer 135. In this case, while a step difference (a height difference is generated when the residual exists or does not exist) is generated so that the contact angle is inaccurately measured, the contact angle is lowered due to the residual layer 135.

In addition, while FIGS. 4A and 4B illustrate extreme two cases which have no capping layer or a substantial residual capping layer, there may be only a trace of the capping material, e.g., a silicon nitride, on the polysilicon layer 160, in many instances. Specifically, the contact angle varies depending on an amount of the silicon nitride layer remaining on the polysilicon layer 160. While not numerically expressed, as the amount of the remaining silicon nitride increases, the contact angle is lowered, the hydrophilicity increases, and the hydrophobicity is lowered. Therefore, in accordance with the embodiment, the existence of the residual layer means that the contact angle is in a range of not more than about 40° depending on a residual amount of the capping layer material. The capping layer material, such as silicon nitride, causes the hydrophilicity to increase. On the other hand, no existence of the residual layer means that the contact angle is in a range of 40° to 80° to cause the hydrophobicity to increase. In one embodiment, the reason for limiting the contact angle of not more than 80° is that the contact angle of the water droplet cannot be more than 80° due to surface tension and gravity of the water droplet. A skilled artisan will appreciate that the contact angle range may vary depending on the liquid used for measuring the contact angle.

In one embodiment, when the capping layer 130 has been substantially completely removed, as shown in FIG. 4A, the contact angle Θ1 is within a range of about 40° to about 80°. When the capping layer 130 has not been substantially completely removed, leaving a residual layer 135 on the polysilicon layer 160, shown in FIG. 4B, the contact angle Θ2 is not more than about 40°.

When the residual layer 135 (i.e., a silicon nitride layer, a silicon oxide layer, or a multi-layer thereof) remains on the polysilicon layer 160, a metallic material such as a metal catalyst remaining therein may contaminate a surface of the polysilicon layer 160. It may form an undesired layer between the polysilicon layer 160 and the gate insulating layer, adversely affecting the threshold voltage of a thin film transistor.

Figure 6A:
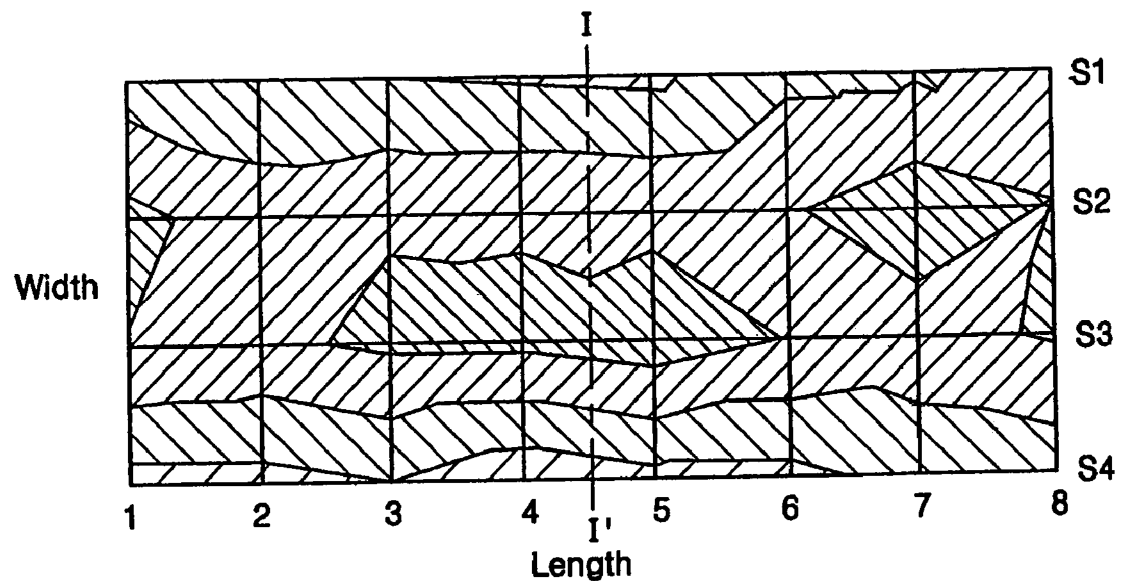
FIGS. 6A and 6B are graphs showing a threshold voltage of a thin film transistor having a polysilicon layer on which a residual layer exists.
Figure 6B:
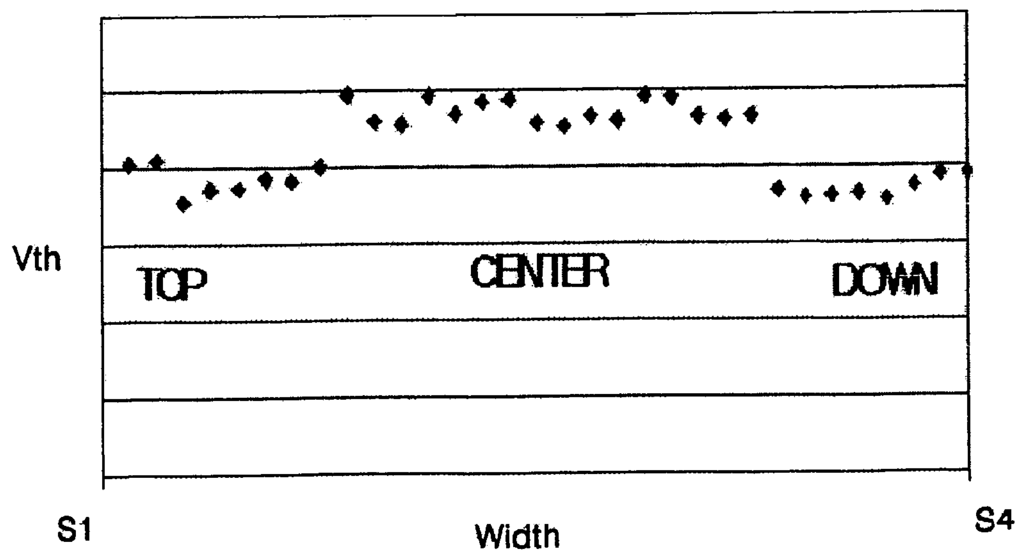
Figure 6C:
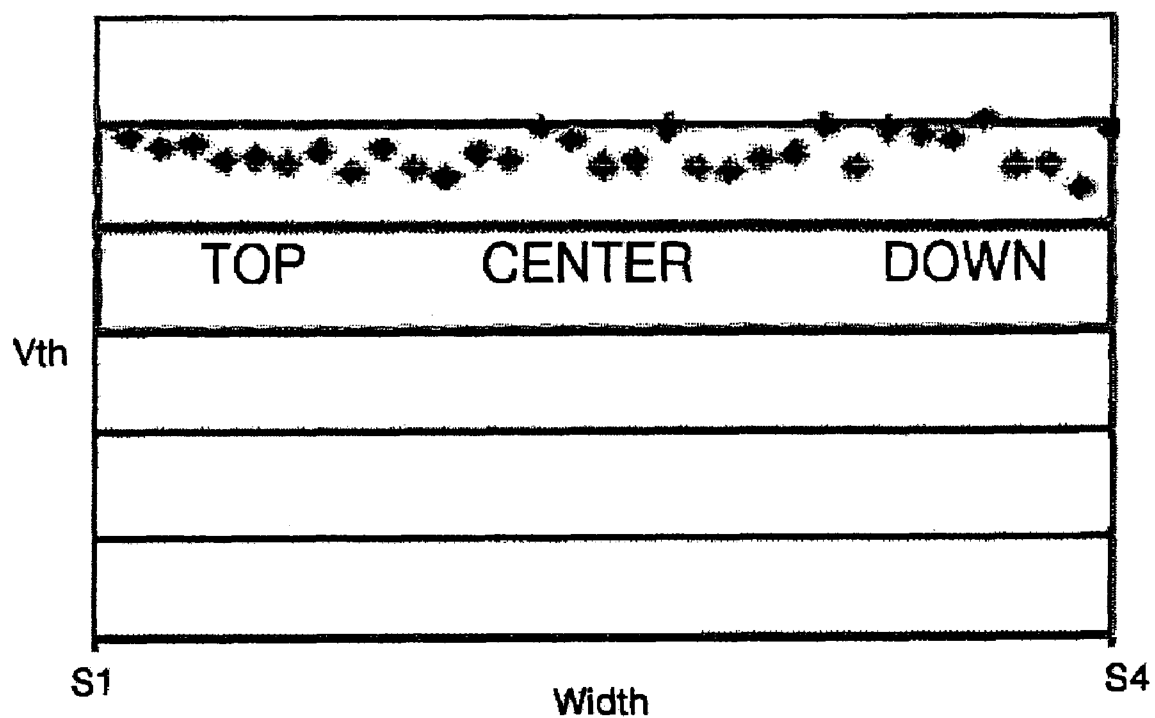
FIG. 6C is a graph showing a threshold voltage of a thin film transistor having a polysilicon layer on which no residual layer exists.

FIGS. 6A to 6C are graphs showing dispersion characteristics of the threshold voltage when the capping layer is incompletely removed, i.e., the capping layer exists (shown in FIGS. 6A and 6B), and when the capping layer is substantially completely removed, i.e., when substantially no capping layer exists (shown in FIG. 6C).

At this time, contact angles of FIGS. 6A and 6B were measured as 30°, i.e., not more than about 40°. A contact angle of FIG. 6C was measured as 60°, i.e., within a range of about 40° to about 80°.

Referring to FIGS. 6A and 6B, while the process of removing the capping layer 130 is performed after crystallizing the amorphous silicon layer 120 using an SGS crystallization method, the capping layer 130 may be incompletely removed to cause the residual layer 135 to remain, specifically at a center of the substrate. When the residual layer 135 remains on the polysilicon layer on the substrate, after fabricating a thin film transistor, its threshold voltage varies depending on the existence of the residual layer of the capping layer to degrade dispersion characteristics of the entire substrate.

As a result, when a substantial portion of the residual layers remains on the center of the substrate as shown in FIG. 6A, the threshold voltage of the center of the substrate is higher than that of an edge of the substrate as shown in FIG. 6B, thereby making dispersion of the threshold voltages irregular all over the substrate. It means that each of the thin film transistors has irregular characteristics all over the substrate.

In FIG. 6A, the smaller an interval between hatches is, the more the residual layer remains. The same threshold voltages are represented in the same region. FIG. 6B illustrates threshold voltage values measured along line I-I' of FIG. 6A.

In this process, when the residual layer 135 of the capping layer 130 does not exist, it will be appreciated that the threshold voltage values of the center or the edge of the substrate are uniform as shown in FIG. 6C, and uniformity of characteristics of each thin film transistor formed on the entire substrate is excellent. At this time, FIG. 6C illustrates the threshold voltage values of the substrate with no residual layer, measured in the same region as the line I-I' of FIG. 6A.

Therefore, as described with reference to FIG. 4A, after removing the metal catalyst layer 140 and the capping layer 130, in order to confirm whether the capping layer 130 is substantially completely removed, the contact angle of the polysilicon layer 160 is measured. Therefore, it is possible to fabricate a thin film transistor having excellent threshold voltage if subsequent processes are performed only when the contact angle Θ1 is in a range of about 40° to about 80°. Further, it is also possible to obtain the substrate having excellent uniformity of the threshold voltage.

Figure 5:
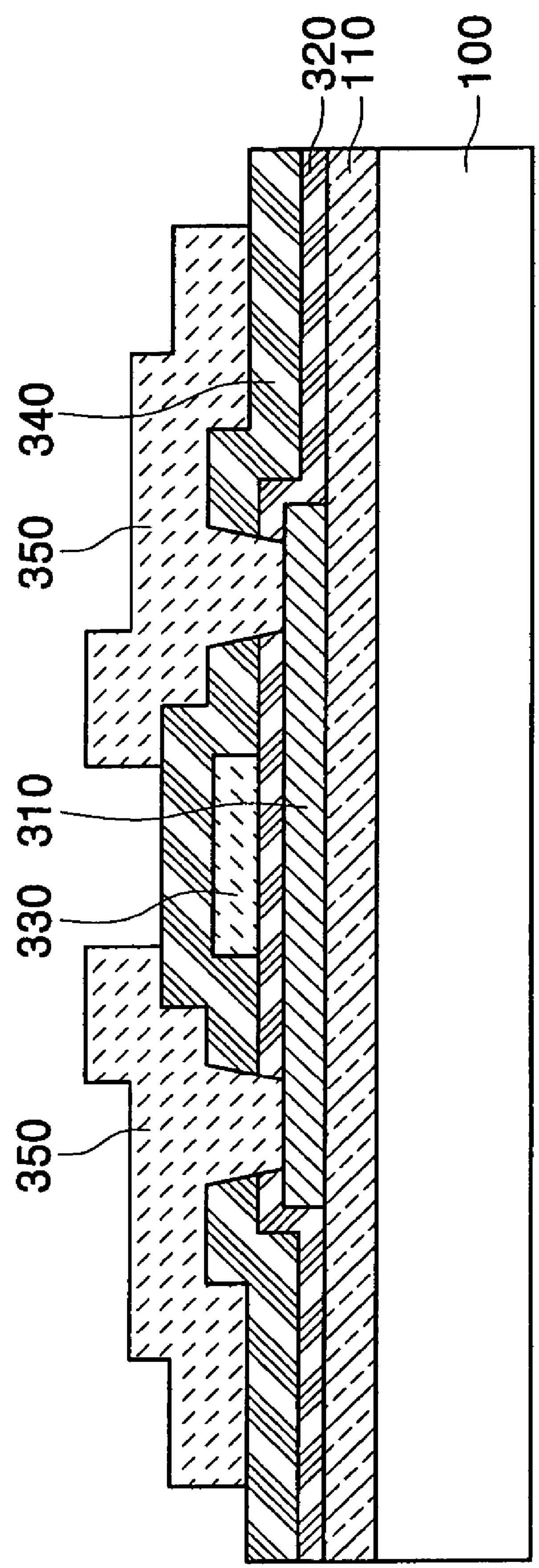
FIG. 5 is a cross-sectional view showing a thin film transistor having a polysilicon layer fabricated in accordance with an embodiment.

FIG. 5 is a cross-sectional view showing a process of fabricating a thin film transistor using a polysilicon layer fabricated in accordance with an embodiment. Referring to FIG. 5, the polysilicon layer 160, on which the residual layer 135 as shown in FIG. 4A does not exist, is patterned to form a semiconductor layer 310. Then, a gate insulating layer 320, a gate electrode 330, and an interlayer insulating layer 340 are formed over the substrate 100, on which the semiconductor layer 310 is formed.

Next, the interlayer insulating layer 340 and the gate insulating layer 320 are etched to form a contact hole for exposing a predetermined region of the semiconductor layer 310, and source and drain electrodes 350 contacting the semiconductor layer 310 through the contact hole are formed to complete a thin film transistor.

As can be seen from the foregoing, a thin film transistor and a method of fabricating the same in accordance with the embodiments are capable of fabricating a semiconductor layer using a polysilicon layer having a contact angle of about 40 to about 80° to provide a thin film transistor having excellent threshold voltage characteristics and a substrate having uniform threshold voltages all over the substrate, since there is no impurities at an interface between the semiconductor layer and a gate insulating layer.

Although the invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor comprising:

a substrate;

a semiconductor layer containing a polysilicon material crystallized by an super grain silicon (SGS) crystallization method and disposed over the substrate, wherein the polysilicon material is defined as having a contact angle with a liquid droplet of about 40 to about 80 degrees when the liquid droplet is placed onto a flat surface made of the polysilicon material; and a gate insulating layer, a gate electrode, an interlayer insulating layer, and source and drain electrode, which are disposed over the semiconductor layer.

2. The thin film transistor according to claim 1, wherein the liquid droplet has a diameter between about 2 mm and about 5 mm.

3. The thin film transistor according to claim 1, wherein the liquid droplet comprises a water droplet.

4. The thin film transistor according to claim 1, wherein the polysilicon material contains a metal catalyst, the metal catalyst having a concentration of about $10^{13}$ atoms/$cm^2$ or less.

5. A method of making a thin film transistor, the method comprising:

forming a semiconductor layer over a substrate, the semiconductor layer comprising amorphous silicon;

forming a capping layer over the semiconductor layer;

forming a metal catalyst layer over the capping layer, the metal catalyst layer comprising a metal catalyst;

annealing the substrate, the semiconductor layer, the capping layer, and the metal catalyst layer, such that at least a portion of the metal catalyst diffuses into the semiconductor layer, and such that the amorphous silicon is crystallized into polysilicon;

removing the metal catalyst layer; and removing the capping layer from over the semiconductor layer, to an extent that, when a liquid droplet is placed over the semiconductor layer, a contact angle between the semiconductor layer and the liquid droplet is from about 40 degrees to about 80 degrees.

6. The method of claim 5, further comprising measuring the contact angle after removing the capping layer.

7. The method of claim 5, wherein the capping layer is single-layered.

8. The method of claim 5, wherein the capping layer comprises multiple layers.

9. The method of claim 5, wherein the capping layer comprises one or more materials selected from the group consisting of silicon oxide and silicon nitride.

10. The method of claim 9, wherein the polysilicon is more hydrophobic than the capping layer.

11. The method of claim 9, wherein, after removing the catalyst layer and before removing the capping layer, the capping layer has a contact angle of about 40 degrees or less when a liquid droplet is placed on the capping layer.

12. The method of claim 5, further comprising patterning the semiconductor layer after removing the capping layer.

13. The method of claim 5, wherein the liquid droplet has a diameter between about 2 mm and about 5 mm.

14. The method of claim 5, wherein the liquid droplet comprises a water droplet.

15. The method of claim 5, wherein the contact angle is an acute angle formed between a baseline of the liquid droplet and a tangential line at a droplet boundary.

16. A method of making a display device comprising a thin film transistor (TFT), the method comprising:

providing an intermediate device comprising a substrate, a polysilicon layer over the substrate, a capping layer over the polysilicon layer;

removing the capping layer from over the polysilicon layer; and determining whether the capping layer has been substantially completely removed from over the polysilicon layer, wherein the determining comprises: placing a liquid droplet over the polysilicon layer; and measuring a contact angle between a baseline of the liquid droplet and a tangential line at a droplet boundary.

17. The method of claim 16, further comprising, after measuring the contact angle, patterning the semiconductor layer if the measured contact angle is from about 40 degrees to about 80 degrees.

* * * * *